US012664337B2

(12) United States Patent
Musuvathy et al.

(10) Patent No.: US 12,664,337 B2
(45) Date of Patent: Jun. 23, 2026

(54) MACHINE LEARNING-BASED SELECTIVE INCARNATION OF COMPUTER-AIDED DESIGN OBJECTS

(71) Applicants: Siemens Industry Software Inc., Plano, TX (US); SIEMENS AKTIENGESELLSCHAFT, Munich (DE)

(72) Inventors: Suraj Ravi Musuvathy, Princeton Junction, NJ (US); George Allen, Okinawa (JP); Hiren Dedhia, Santa Ana, CA (US)

(73) Assignee: Siemens Industry Software Inc., Plano, TX (US)

( * ) Notice: Subject to any disclaimer, the term of this patent is extended or adjusted under 35 U.S.C. 154(b) by 1044 days.

(21) Appl. No.: 17/777,525

(22) PCT Filed: Dec. 5, 2019

(86) PCT No.: PCT/US2019/064615
§ 371 (c)(1),
(2) Date: May 17, 2022

(87) PCT Pub. No.: WO2021/112847
PCT Pub. Date: Jun. 10, 2021

(65) Prior Publication Data
US 2022/0405447 A1        Dec. 22, 2022

(51) Int. Cl.
*G06F 30/27*          (2020.01)
*G06F 30/10*          (2020.01)

(52) U.S. Cl.
CPC ............. *G06F 30/27* (2020.01); *G06F 30/10* (2020.01)

(58) Field of Classification Search
CPC ................................ G06F 30/27; G06F 30/10
See application file for complete search history.

(56) References Cited

U.S. PATENT DOCUMENTS

2018/0341248 A1    11/2018  Relativity
2019/0026917 A1*    1/2019  Liao ....................... G06V 10/82
(Continued)

FOREIGN PATENT DOCUMENTS

WO        2018/031904          2/2018

OTHER PUBLICATIONS

Christian Sigg, NPL, "Representation and Rendering of Implicit Surfaces", Published 2006 (Year: 2006).*
(Continued)

*Primary Examiner* — Rehana Perveen
*Assistant Examiner* — Angel Calle

(57)                ABSTRACT

A computing system may include an instance identification engine configured to determine a selected subset of pattern instances of a programmatic pattern used to represent a geometry of a computer-aided design (CAD) object, including by identifying a CAD operation to perform on the CAD object; determining a sampled point set in the CAD object applicable to the CAD operation; providing the sampled point set as an input to an inversion machine-learning (ML) model trained to output a given pattern instance of the programmatic pattern for an input point of the CAD object; and determining, as the selected subset, an output set of pattern instances provided by the inversion ML model for the sampled point set. The system may also include an object incarnation engine configured to incarnate a geometry of the selected subset of pattern instances to perform the CAD operation on the CAD object.

20 Claims, 8 Drawing Sheets

700

Determine a selected subset of pattern instances of a programmatic pattern used to represent a geometry of a CAD object          702

Incarnate a geometry of the selected subset of pattern instances to perform the CAD operation on the CAD object          710

Determine a sampled point set of the CAD object applicable to CAD operation to perform on the CAD object          704

Provide the sampled point set as an input to an inversion ML model trained to output a given pattern instance of the programmatic pattern for an input point of the CAD object          706

Determine, as the selected subset, an output set of pattern instances provided by the inversion ML model for the sampled point set          708

(56)                    References Cited

U.S. PATENT DOCUMENTS

| | | |
|---|---|---|
| 2019/0061269 A1 | 2/2019 | Messner |
| 2019/0176405 A1 | 6/2019 | Inc |
| 2020/0302241 A1* | 9/2020 | White .................. G06V 10/772 |

OTHER PUBLICATIONS

Oleg Fryazinov et al.: "Interactive ray shading of FRep objects", Computer Science, Jan. 1, 2008 (2008-01-01), XP055426842, 8 pages.
PCT Search Report dated Aug. 11, 2020, for PCT Application No. PCT/US2019/064615, 15 pages.

* cited by examiner

Computing System 100

Instance Identification Engine  110

Object Incarnation Engine  112

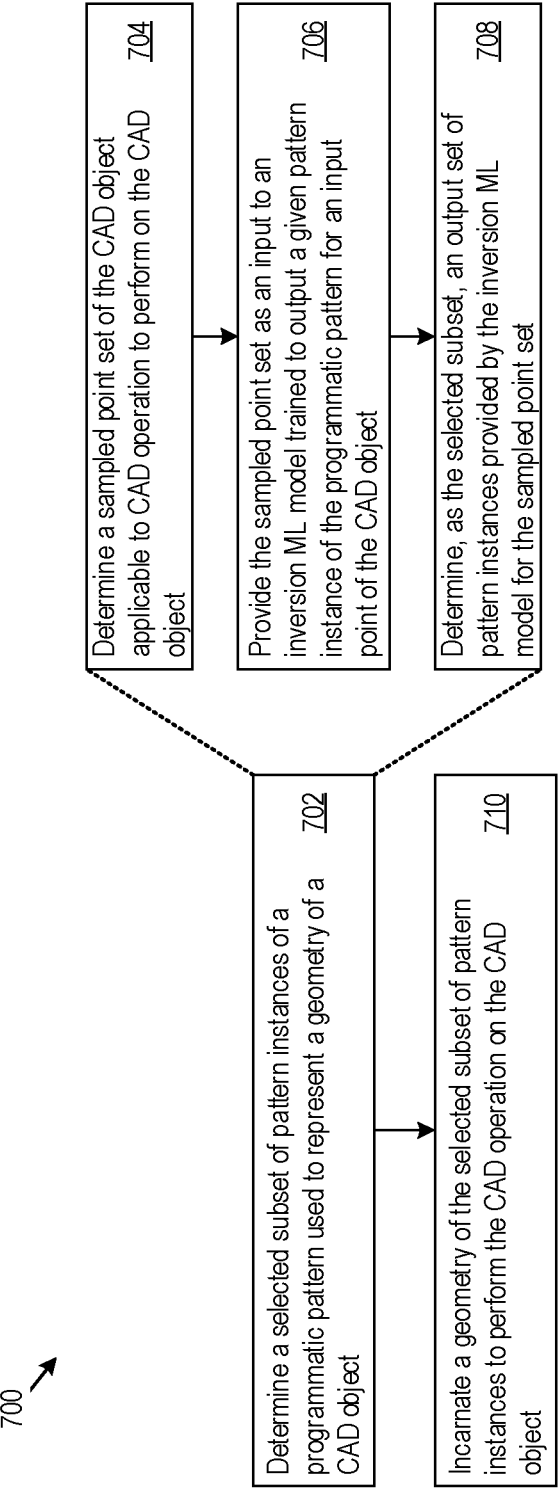

700

Determine a selected subset of pattern instances of a programmatic pattern used to represent a geometry of a CAD object        702

Determine a sampled point set of the CAD object applicable to CAD operation to perform on the CAD object        704

Provide the sampled point set as an input to an inversion ML model trained to output a given pattern instance of the programmatic pattern for an input point of the CAD object        706

Determine, as the selected subset, an output set of pattern instances provided by the inversion ML model for the sampled point set        708

Incarnate a geometry of the selected subset of pattern instances to perform the CAD operation on the CAD object        710

Figure 7

MACHINE LEARNING-BASED SELECTIVE INCARNATION OF COMPUTER-AIDED DESIGN OBJECTS

BACKGROUND

Computer systems can be used to create, use, and manage data for products and other items. Examples of computer systems include computer-aided design (CAD) systems (which may include computer-aided engineering (CAE) systems), computer-aided manufacturing (CAM) systems, visualization systems, product data management (PDM) systems, product lifecycle management (PLM) systems, and more. These systems may include components that facilitate the design and simulated testing of product structures and product manufacture.

BRIEF DESCRIPTION OF THE DRAWINGS

Certain examples are described in the following detailed description and in reference to the drawings.

FIG. 7 shows an example of logic that a system may implement to support ML-based selective incarnation of CAD objects.

DETAILED DESCRIPTION

Figure 1:
FIG. 1 shows an example of a computing system that supports machine learning (ML)-based selective incarnation of CAD objects.

CAD systems and applications can support the creation, design, representation, and use of CAD objects in various forms. One common form used by CAD applications is a boundary representation (also referred to as a B-Rep). B-Reps may define the object boundary of a CAD object through 2-dimensional (2D) or 3-dimensional (3D) geometric elements, such as curves, edges, faces, shapes, meshes, etc. Boundary representation models, by their nature, may be limited to describe only the boundaries of a CAD object, e.g., geometry that forms an outer boundary of the CAD object. Regions enclosed by boundary representations are typically limited in classification merely as wholly solid or wholly void.

B-Rep definitions of CAD objects may be incapable or inefficient at capturing complex internal geometries of CAD objects. As 3D design, 3D printing, additive manufacturing, and other 3D technology capabilities increase, the design and manufacture of 3D parts with geometrically complex internal and external structures is becoming increasingly feasible. Complex 3D geometries, when modeled geometrically through boundary representations (e.g., mesh faces), may require compositions comprising millions of geometric elements (or more) and include considerable geometric intricacy (e.g., high genus, highly curved, variable and irregular). Naïve implementations of complex 3D geometries via B-Reps, whether to model internal additive materials or complex exterior geometry, can incur significant performance and memory penalties in order to process millions of meshes or more.

Programmatic representation of CAD objects can provide performance benefits over naïve implementations of complex 3D geometries via B-Reps or other mesh geometries. For instance, 3D lattices can be programmatically represented as a geometric pattern that is repeated to create complex 3D shaping or geometry. Programmatic patterns may be represented in a procedural form instead of as an explicit geometric representation of millions of B-Rep faces or more, and thus can be a more concise form of geometry representation as compared to B-Reps. In some instances, programmatic patterns can take form of a particular pattern instance (e.g., a pattern kernel) that is repeated across a 2D or 3D space to form an internal or external geometry of a CAD object. Example parts in which programmatic patterning may be used to efficiently represented CAD geometry include additive lattice structures that form an interior of a 3D part, rivets or fasteners, geometric textures on surfaces for improved grip, flow turbulators, coating and paint adhesion surfaces, and many more.

Programmatic patterns (e.g., specified in a high-level computer programming language) may provide a concise and flexible framework for designing and representing complex 3D geometries in CAD systems. However, CAD operations performed on programmatically-represented CAD objects may need to process, modify, simulate, or otherwise instantiate a 3D geometry of the CAD objects. In order to perform such CAD operations, some CAD systems may incarnate the entire 3D geometry of a given CAD object. Incarnation may refer to a process in which a programmatic representation of a geometry (e.g., via code) is transformed into an express geometric representation (e.g., a B-Rep). For programmatic patterns comprised of many pattern instances (e.g., in the thousands, tens of thousands, millions, or more), a B-Rep representation of the entire 3D geometry of a CAD object may be prohibitively large in size, adversely impacting the memory and computation efficiency of CAD systems.

The disclosure herein may provide systems, methods, devices, and logic for machine learning-based selective incarnation of CAD objects. The ML-based selective incarnation features described herein may provide capabilities to incarnate some, but not all, of a 3D geometry of a CAD object. Such selective incarnation may include incarnating relevant portions of a CAD geometry applicable to a given CAD operation, while other non-relevant portions of the CAD geometry remain in programmatic form. Machine learning techniques may be applied to efficiently and effectively identify selected subsets of pattern instances to incarnate for specific CAD operations.

The ML-based selective incarnation features described herein may improve computation efficiency in CAD systems, in some cases through selected subset determinations with a complexity of O(1) (e.g., constant time regardless of a number of pattern instances in a CAD geometry). Moreover, the ML-based selective incarnation features described herein may provide a scalable lazy evaluation approach for programmatic patterns independent of the underlying programmatic implementation. As such, computational efficiencies via the present disclosure can be achieved for arbitrary programs, whether for simple programs or complex programmatic logic that includes loops and conditional statements.

These and other ML-based selective incarnation features and technical benefits are described in greater detail herein.

FIG. 1 shows an example of a computing system 100 that supports ML-based selective incarnation of CAD objects. The computing system 100 may take the form of a single or multiple computing devices such as application servers, compute nodes, desktop or laptop computers, smart phones or other mobile devices, tablet devices, embedded controllers, and more. In some implementations, the computing system 100 implements a CAD system, tool, application, or program to aid users in the design, analysis, simulation, and manufacture of products and 3D parts.

As an example implementation to support any combination of the ML-based selective incarnation features described herein, the computing system 100 shown in FIG. 1 includes an instance identification engine 110 and an object incarnation engine 112. The computing system 100 may implement the engines 108 and 110 (including components thereof) in various ways, for example as hardware and programming. The programming for the engines 108 and 110 may take the form of processor-executable instructions stored on a non-transitory machine-readable storage medium and the hardware for the engines 108 and 110 may include a processor to execute those instructions. A processor may take the form of single processor or multi-processor systems, and in some examples, the computing system 100 implements multiple engines using the same computing system features or hardware components (e.g., a common processor or a common storage medium).

In operation, the instance identification engine 110 may determine a selected subset of pattern instances of a programmatic pattern used to represent a geometry of a CAD object. The instance identification engine 110 may do so by determining a sampled point set in the CAD object applicable to a CAD operation to perform on the CAD object, providing the sampled point set as an input to an inversion ML model trained to output a given pattern instance of the programmatic pattern for an input point of the CAD object, and determining, as the selected subset, an output set of pattern instances provided by the inversion ML model for the sampled point set. In operation, the object incarnation engine 112 may incarnate a geometry of the selected subset of pattern instances to perform the CAD operation on the CAD object.

These and other ML-based selective incarnation features are described in greater detail next. While some of the discussion here is provided using 2D geometries as illustrative examples, any of the ML-based selective incarnation features described herein may be consistently applied to support any CAD geometry (e.g., 3D geometries, internal lattice structures, complex exterior patterned designs, etc.).

Figure 2:
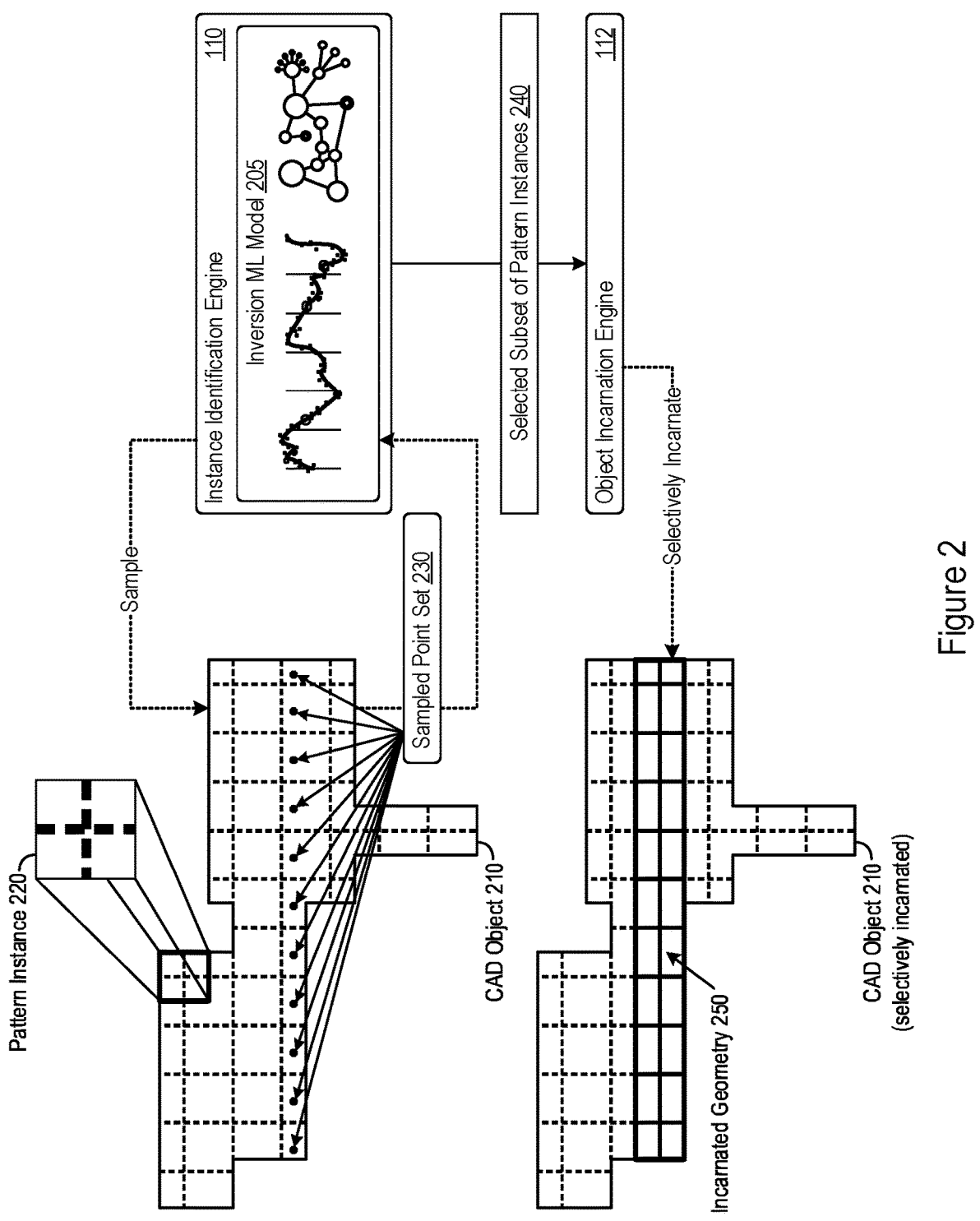
FIG. 2 shows an example of ML-based selective incarnation by a computing system.

FIG. 2 shows an example of ML-based selective incarnation by a computing system. As an illustrative example, FIG. 2 depicts a computing system in the form of an instance identification engine 110 and an object incarnation engine 112, which the computing system may implement as a combination of hardware and software.

Also shown in FIG. 2 is an inversional ML model 205, described in greater detail herein. The inversion ML model 205 may implement or provide any number of machine learning techniques to determine selective portions of a CAD geometry to incarnate for given CAD operations. To support any of the ML-based selective incarnation features presented herein, the inversion ML model 205 may implement any number of supervised, semi-supervised, unsupervised, or reinforced learning models. The inversion ML model 205 may include Markov chains, context trees, support vector machines, neural networks, Bayesian networks, or various other machine learning components. In some examples, the inversion ML model 205 may be trained through random forest or residual neural network ML techniques, though any number of additional or alternative machine-learning techniques and capabilities are contemplated herein to implement, train, or otherwise utilize the inversion ML model 205. In the example shown in FIG. 2, the instance identification engine 110 itself implements the inversion ML model 205 (e.g., using local resources to store a trained model). In other examples, the instance identification engine 110 may remotely access or externally interface with the inversion ML model 205.

As a continuing example to describe the ML-based selective incarnation features presented herein, a CAD object 210 is shown. Internal or external geometry of the CAD object 210 may be represented programmatically (also referred to as a procedural representation). A programmatic or procedural representation may provide a code or function-based representation of CAD geometry (e.g., in a non-incarnated form). 3D Lattice structures, as one example, may be represented programmatically as a programmatic pattern repeated across delineated portions of a CAD object to represent 3D lattice geometry of the CAD object, and in a form that does not explicitly incarnate the lattice geometry into B-Rep form.

In the example shown in FIG. 2, an interior geometry of the CAD object 210 is represented as a programmatic pattern of repeated pattern instances that fill an interior region of the CAD object 210. One given instance of the programmatic pattern is labeled in FIG. 2 as the pattern instance 220. The dotted lines in the pattern instance 220 of the CAD object 210 are used to indicate a programmatically represented state (e.g., non-incarnated geometry), and dotted geometry portions of the CAD object 210 may likewise represent a programmatically represented portions. Accordingly, the entire internal geometry of the CAD object 210 may be represented programmatically via a programmatic pattern of repeated pattern instances (as in the depicted CAD object 210 with the labeled pattern instance 220).

To process the CAD object 210, various CAD operations may be supported by CAD systems. Many CAD operations require computations or detailed processing on only selective or localized portions of a CAD object. Instead of incarnating the entire programmatic pattern of the CAD object 210, the instance identification engine 110 may identify localized pattern instances of the CAD object 210 as required for computations of a given CAD operation. Instead of incarnating the entirety of the programmatic pattern of the CAD object 210, localized and selective incarnation may increase computational efficiency by reducing the memory and processing resources required to perform such CAD operations.

To support selective incarnation, the instance identification engine 110 may determine a selected subset of pattern instances of the CAD object 210 to incarnate for a given CAD operation. Selective subset determinations may also be referred to as a range-finding or inversion process, as an "inverse" set of pattern instances may be identified given a set of points (e.g., coordinates) of the CAD object 210. In effect, the instance identification engine 110 may determine a selected subset of pattern instances that occupy a given query region, and the query region may be representative of a portion of the CAD object that a given CAD operation performs computations on or otherwise processes.

In some examples, the instance identification engine 110 may address a problem in which a programmatic pattern L of pattern instances covers a region R of a CAD object (e.g., R is a 3D space of internal or external geometry of the CAD object). The instance identification engine 110 may interpret the region R of the CAD object as being subdivided into geometric blocks, such that each geometric block contains a (single) pattern instance of the programmatic pattern L. For a given query region Q, the instance identification engine 110 may determine which geometric blocks contain the query region Q, which may in turn provide a subset of pattern instances that represent the query region Q. A query region Q may represent a portion of a CAD object applicable to a given CAD operation, and a subset of pattern instances that contain a query region Q may thus represent a selected subset of pattern instances applicable to the given CAD operation.

The instance identification engine 110 may identify, designate, or label geometric blocks in various ways. For a 3D geometry, the instance identification engine 110 may assign block identifiers via indices, e.g., by assigning a given geometric block with a block ID $B_{(i, j, k)}$, $i=0 \ldots n_i$, $j=0 \ldots n_j$, $k=0 \ldots n_k$. The index values i, j, and k may be represented as sequential integers and may be respectively associated with the x-axis, y-axis, and z-axis of a 3D region R. Accordingly, the instance identification engine 110 may set a particular index (i, j, k) to uniquely represent a particular geometric block of a programmatic pattern (and thus uniquely identify a particular pattern instance of the programmatic pattern L that occupies the particular geometric block).

In other examples, the instance identification engine 110 may identify geometric blocks that cover a programmatic pattern based on a given coordinate of the geometric block, e.g., a coordinate included in the geometric block. Example coordinate identifiers for a geometric block include a center coordinate of the geometric block, the coordinate in the geometric block with the lowest (or highest) x-coordinate value, y-coordinate value, and/or z-coordinate value, or any other selected or configured coordinate position within the geometric block. As yet another example, the instance identification engine 110 may label geometric blocks with a unique integer value (e.g., sequentially assigning an ID number to each geometric block). In these ways or various others, the instance identification engine 110 may identify or label geometric blocks such that each geometric block that contains a pattern instance of a programmatic pattern is uniquely identified.

Through identification or labeling of geometric blocks, the instance identification engine 110 may specify a set of geometric blocks that contain a given query region Q for a CAD operation. A brute force approach for identifying the relevant geometric blocks in a query region Q may include testing for containment of the query region Q with each geometric block of the programmatic pattern L. As the number of geometric blocks increases (e.g., $n_i$, $n_j$, and/or $n_k > 100$), such a brute force approach can become computationally intractable or incur increasingly high computational and performance latencies that are not suitable for interactive design applications. Instead of a brute force approach, the instance identification engine 110 may determine a selected subset of pattern instances applicable to a CAD application through machine-learning, which may provide an efficient and scalable approach that can yield significant performance improvements as compared to brute force approaches.

To determine a subset of pattern instances applicable to a CAD operation according to the present disclosure, the instance identification engine 110 may sample points applicable to the CAD operation. The instance identification engine 110 may do so in any way to obtain a set of one or more points in a query region R applicable to the CAD operation. The instance identification engine 110 may sample points in a query region Q at regular or irregular sampling intervals. In the example shown in FIG. 2, the instance identification engine 110 obtains a sampled point set 230, which may be comprised of different points in the CAD object 210 at which a given CAD operation (e.g., a slicing operation) will operate.

In some implementations, the instance identification engine 110 determines the sampled point set 230 by sampling points in the query region Q of a given CAD operation at regular intervals (e.g., at a coordinate spacing) based on the dimensions of geometric blocks for the programmatic pattern. The instance identification engine 110 may set a sampling interval (e.g., along an x-axis, y-axis, or z-axis) such that only a single sample point is collected for each geometric block, that multiple sample points are collected for a given geometric block, or according to any other regular or irregular sampling parameters. Other examples of sampling parameters that an instance identification engine 110 may apply include random sampling across a query region Q, collecting (at least) a threshold number of sample points in the query region Q, and more.

The instance identification engine 110 may provide a sampled point set as an input to the inversion ML model 205, and the inversion ML model 205 may be trained to output a selected subset of pattern instances that cover the coordinates/points included in the sampled point set for a query region Q. (Note that training of the inversion ML model 205 is described in greater detail below in connection with FIG. 3). In some instances, the inversion ML model 205 may output a selected subset of pattern instances in O(1) time, as the inversion ML model 205 may support coordinate-to-pattern instance mappings in constant time (e.g., independent of a number of pattern instances in the programmatic pattern used to represent a geometry of the CAD object 210). The memory requirements for the inversion ML model 205 may be as few as multiple kilobytes, which is nearly negligible in modern computing systems. As such, ML-based selective incarnation through the inversion ML model 205 may provide computational and memory improvements to CAD applications and CAD systems as compared to brute force pattern instance determinations or complete geometry incarnation techniques.

In FIG. 2, the inversion ML model 205 outputs a selected subset of pattern instances 240 for the sampled point set 230, and the instance identification engine 110 may provide the selected subset of pattern instances 240 to the object incarnation engine 112 as a localized or specific set of pattern instances applicable to a given CAD operation. The instance identification engine 110 may provide the selected subset of pattern instances 240 in a manner consistent with how geometric blocks of the programmatic pattern are identified. As such, the selected subset of pattern instances 240 may identify or designate particular pattern instances for incarnation through geometric block identifiers (e.g., a set of (i, j, k) indices) that in turn identify or represent specific pattern instances.

With the selected set of pattern instances 240, the object incarnation engine 112 may incarnate, into a geometric form, a selected portion of the CAD object 210. FIG. 2 depicts an example of a selectively incarnated CAD object 210 that includes the incarnated geometry 250 (shown in solid lines to represent an express geometric representation, such as via mesh faces or other B-Rep geometric primitives).

The object incarnation engine 112 may perform a selective incarnation by incarnating the instance patterns identified in the selected subset of pattern instances 240 (e.g., incarnating the pattern instances in each of the geometric blocks specified in the selected subset of pattern instances 240).

Thus, in any of the ways described herein, the object incarnation engine 112 may incarnate a geometry of the selected subset of pattern instances 240 in order to perform a CAD operation on the CAD object 210. Such an incarnation may be selective as the object incarnation engine 112 may determine not to incarnate other portions of the CAD object 210 that are not applicable to the CAD operation.

Figure 3:
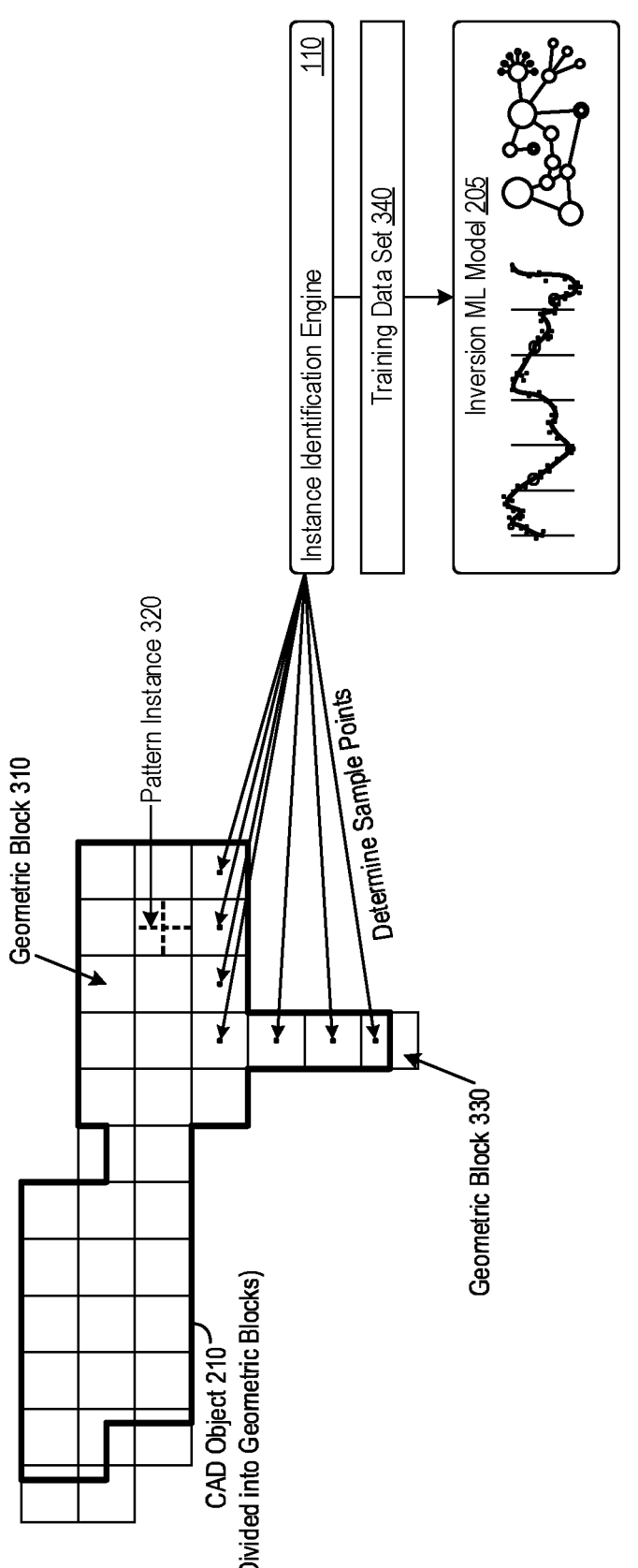
FIG. 3 shows an example training of an inversion ML model by an instance identification engine.

FIG. 3 shows an example training of an inversion ML model 205 by the instance identification engine 110. To train the inversion ML model 205, the instance identification engine 110 may generate a training data set through which to train the inversion ML model 205.

In generating training data, the instance identification engine 110 may evaluate a programmatic pattern that defines a geometry of a CAD object. In the example shown in FIG. 3, the instance identification engine 110 evaluates a programmatic pattern that defines a geometry of the CAD object 210, which may include thirty-seven (37) different pattern instances (at least in part) that represent an internal geometry of the CAD object 210. In FIG. 3, the illustrated CAD object 210 is divided into thirty-seven (37) geometric blocks, including the one labeled in FIG. 3 as geometric block 310.

The instance identification engine 110 may identify the geometric blocks that form the programmatic pattern in any of the ways described herein, utilizing block IDs to create a training data set for the inversion ML model 205. In that regard, the instance identification engine 110 may evaluate the CAD object 210 and underlying programmatic pattern to identify each of the block identifiers (e.g., each of the (i, j, k) indices) that represent the geometry of the CAD object 210 (that is, a region R of the CAD object that contains the programmatic pattern L). As depicted in FIG. 3, each geometric block of the CAD object 210 may contain a single pattern instance of the programmatic pattern. To illustrate, the pattern instance 320 in FIG. 3 is contained in a single geometric block of the internal geometry of the CAD object 210.

Continuing the discussion with regards to generation of training data, the instance identification engine 110 may sample points within each geometric block of the CAD object 210. For each given pattern instance of the programmatic pattern that represents geometry of the CAD object 210, the instance identification engine 110 may determine a sample point located within a geometric block that contains the given pattern instance. In some examples, the instance identification engine 110 identifies sampled points as coordinates, e.g., sample point coordinates $(x_{is}, y_{js}, z_{ks})$, $s=0 \ldots m$ for each geometric block, wherein m is a number of sample points for each geometric block. The number of sample points collected from a given geometric block may be configurable, and in some implementations, the instance identification engine 110 samples only a single point/coordinate from each geometric block of the CAD object 210.

The instance identification engine 110 may determine sample points for training data generation according to any number of sampling parameters, which may overlap with any of the sampling parameters described herein for a query region Q. For instance, the instance identification engine 110 may determine a threshold number of sample points from each of the thirty-seven (37) geometric blocks of the programmatic pattern in FIG. 3, whether at regular or irregular sample intervals (e.g., proportional to the dimensions of the geometric blocks). For clarity purposes, an example sample point is illustrated in FIG. 3 for only seven (7) of the thirty-seven (37) geometric blocks that form the geometry of the CAD object 210, and the instance identification engine 110 may likewise determine sample points from the other geometric blocks as well.

Note that in FIG. 3, some of the geometric blocks include portions within the CAD object 210 and portions outside the CAD object 210. One example of such a geometric block is shown in FIG. 3 through the geometric block 330, a portion of which is included within the CAD object 210 and another portion of which lies outside the boundary of the CAD object 210. For such geometric blocks that are only partially-included within the CAD object 210, the instance identification engine 110 may, in some examples, specifically sample points within the CAD object 210. In other examples, the instance identification engine 110 may determine a sample point located within the geometric block 330 without regard to (e.g., independent of) whether the sample point is located within the CAD object 210 or not.

The instance identification engine 110 may determine a training data set as a mapping between each geometric block and the sample point(s) located within the geometric block. In FIG. 3, the instance identification engine 110 generates the training data set 340 from the determined sample points collected for the geometric blocks of the CAD object 210. In some examples, the number of entries in a generated training data set for the inversion ML model 205 is equal to the number of geometric blocks of an evaluated programmatic pattern (e.g., one entry for each geometric block, which maps to one or multiple collected sample points located within each geometric block).

The instance identification engine 110 may train the inversion ML model 205 with the generated training data set 340. In doing so, the instance identification engine 110 may train the inversion ML model 205 according to any number or combination of ML techniques. As a particular example, the instance identification engine 110 may train the inversion ML model 205 using random forest techniques, which may provide a reduced training time as compared to other ML techniques like residual neural networks. As each geometric block may uniquely contain a single pattern instance, the inversion ML model 205 may be trained to output a particular pattern instance based on the geometric block that contains the particular pattern instance. As such, training of the inversion ML model 205 may provide a mapping capability to map an input point (e.g., in the form of CAD coordinate) to a given geometric block in a CAD object, and may thus identify a unique pattern instance for the input point.

Once the inversion ML model 205 has been trained by the instance identification engine 110, an input sampled point set determined for a CAD object (e.g., as collected from a query region Q for a given CAD operation) may be provided, and the inversion ML model 205 may provide a mapping to particular pattern instances that contain the sampled point set. Various examples of ML-based selective incarnation for different CAD operations are described next with respect to FIGS. 4, 5, and 6.

Figure 4:
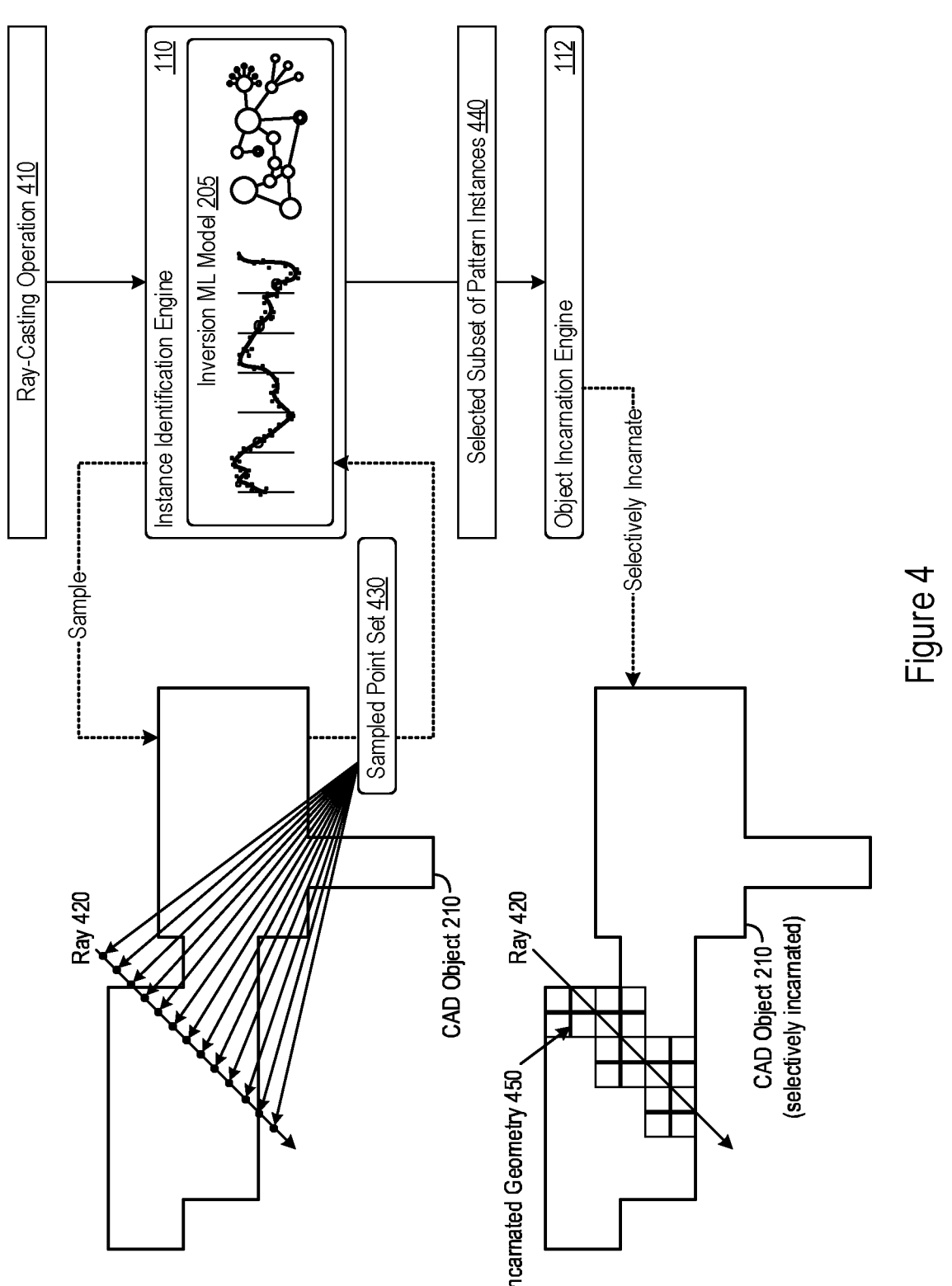
FIG. 4 shows an example of ML-based selective incarnation for a ray-casting CAD operation.

FIG. 4 shows an example of ML-based selective incarnation for a ray-casting CAD operation. In FIG. 4, the instance identification engine 110 may identify that a ray-casting operation 410 is to be performed on the CAD object 210. The ray-casting operation 410 may be performed to detect intersections of a projected ray with pattern instances of the CAD object 210 (e.g., for solid consistency checks).

Identification of a given CAD operation may be performed by identifying a user-selected operation or other user input, by checking current CAD application parameters or state values that specify a current CAD operation, or according to any number of other CAD application or CAD operation monitoring capabilities that a CAD system may provide.

For the ray-casting operation 410, the instance identification engine 110 may determine a sampled point set of the CAD object 210 applicable to the ray-casting operation 410. In particular, the instance identification engine 110 may identify a query region Q for the ray-casting operation 410 as a projected ray cast through the ray-casting operation 410, shown in FIG. 4 as the ray 420. The instance identification engine 110 may sample points in the CAD object 210 along the identified query region Q, in particular along the ray 420 projected for the ray-casting operation 410. In FIG. 4, the instance identification engine 110 obtains the sampled point set 430 determined from the ray 420 and provides the sampled point set 430 as an input to the inversion ML model 205. The inversion ML model 205 may output a selected subset of pattern instances 440, which may be specific to the sampled point set 430 collected for the ray-casting operation 410.

In the example shown in FIG. 4, the selected subset of pattern instances 440 may specify five (5) particular geometric blocks of programmatic pattern of the CAD object 210 that the inversion ML model 205 may map to the ray 420. The object incarnation engine 112 may incarnate the geometry of the selected subset of pattern instances 440 by incarnating a geometry of the pattern instances of the CAD object 210 along the ray 420 projected for the ray-casting operation 410 (shown in FIG. 4 as the incarnated geometry 450).

In the specific example of FIG. 4, the instance identification engine 110 may utilize ML-based techniques to identify five (5) particular pattern instances applicable to the ray-casting operation 410 and the object incarnation engine 112 may selectively incarnate the five (5) particular pattern instances into a geometric form while the other thirty-two (32) pattern instances of the CAD object 210 are determined to remain in programmatic form (e.g., non-incarnated) in performing the ray-casting operation 410. In some implementations, the object incarnation engine 112 may perform the ray-casting operation 410 by performing ray-surface intersection computations on the incarnated geometry 450 of the selected subset of pattern instances 440.

As such, the instance identification engine 110 and object incarnation engine 112 may support ML-based selective incarnation for ray-casting operations.

Figure 5:
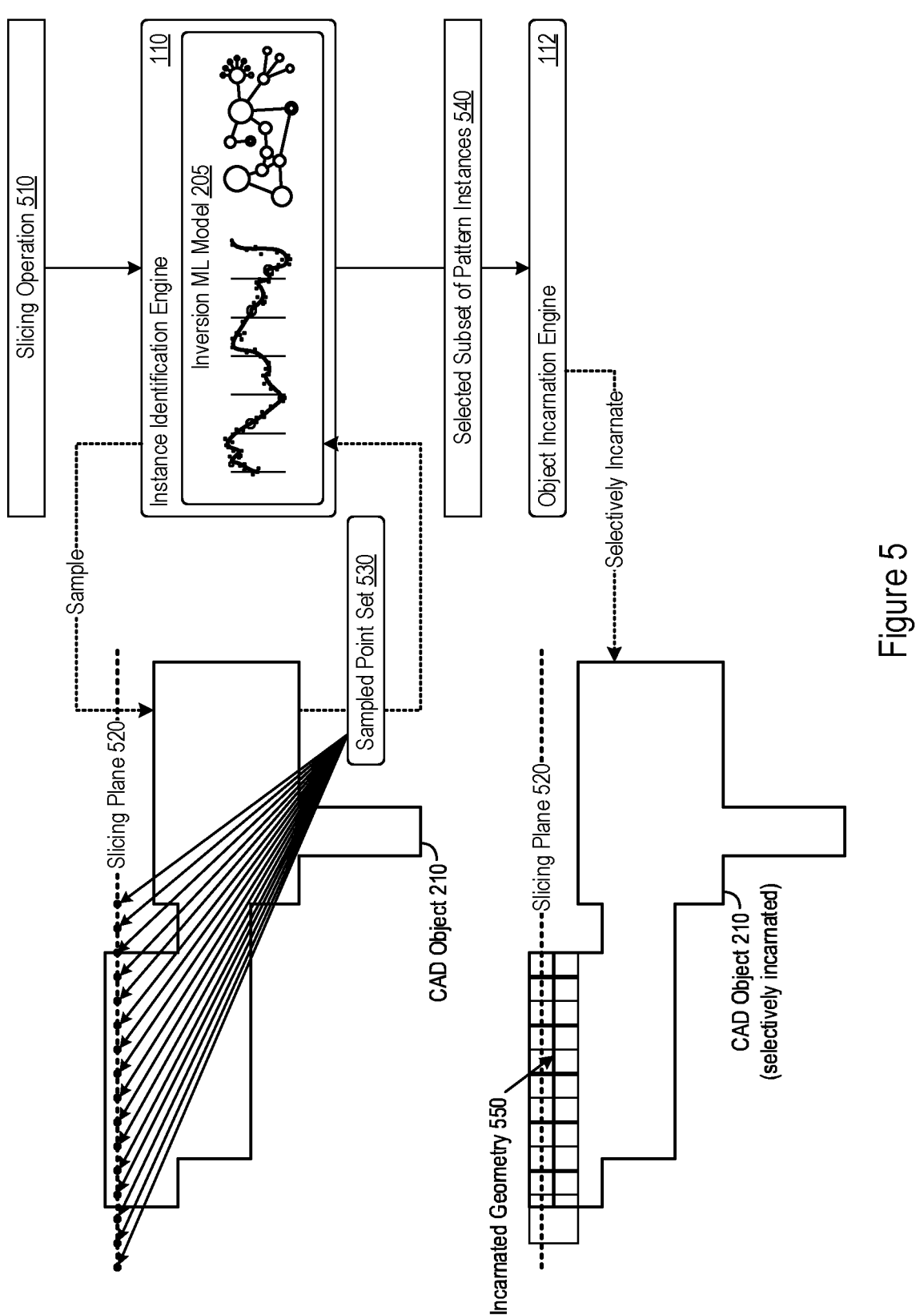
FIG. 5 shows an example of ML-based selective incarnation for a slicing CAD operation.

FIG. 5 shows an example of ML-based selective incarnation for a slicing CAD operation. In FIG. 5, the instance identification engine 110 may identify that a slicing operation 510 is to be performed on the CAD object 210. A slicing operation 510 may divide a CAD object along a slicing plane, shown in 2D line form in FIG. 5 as the slicing plane 520. The slicing operation 510 may be used to compute intersection curves with the slicing plane 520 (e.g., in an additive manufacturing context).

For the slicing operation 510, the instance identification engine 110 may determine a sampled point set of the CAD object 210 applicable to the slicing operation 510. In particular, the instance identification engine 110 may identify a query region Q for the slicing operation 510 as the slicing plane 520. The instance identification engine 110 may sample points in the CAD object 210 within the identified query region Q, particularly within the slicing plane 520 of the slicing operation 510. In FIG. 5, the instance identification engine 110 obtains the sampled point set 530 collected from the slicing plane 520 and provides the sampled point set 530 as an input to the inversion ML model 205. The inversion ML model 205 may output a selected subset of pattern instances 540, which may be specific to the sampled point set 530 collected for the slicing operation 510.

In the example shown in FIG. 5, the selected subset of pattern instances 540 may specify six (6) particular geometric blocks of programmatic pattern of the CAD object 210 that the inversion ML model 205 may map to the slicing plane 520. The object incarnation engine 112 may incarnate the geometry of the selected subset of pattern instances 540 by incarnating a geometry of the pattern instances of the CAD object 210 included in the slicing plane 520 of the slicing operation 510 (shown in FIG. 5 as the incarnated geometry 550).

In the specific example of FIG. 5, the instance identification engine 110 may utilize ML-based techniques to identify six (6) particular pattern instances applicable to the slicing operation 510, and the object incarnation engine 112 may selectively incarnate the six (6) particular pattern instances into a geometric form while the other thirty-one (31) pattern instances of the CAD object 210 are determined to remain in programmatic form in performing the slicing operation 510. In some implementations, the object incarnation engine 112 may perform the slicing operation 510 by computing intersection curves between the incarnated geometry 550 of the selected subset of pattern instances 540 and the slicing plane 520.

As such, the instance identification engine 110 and object incarnation engine 112 may support ML-based selective incarnation for slicing operations.

Figure 6:
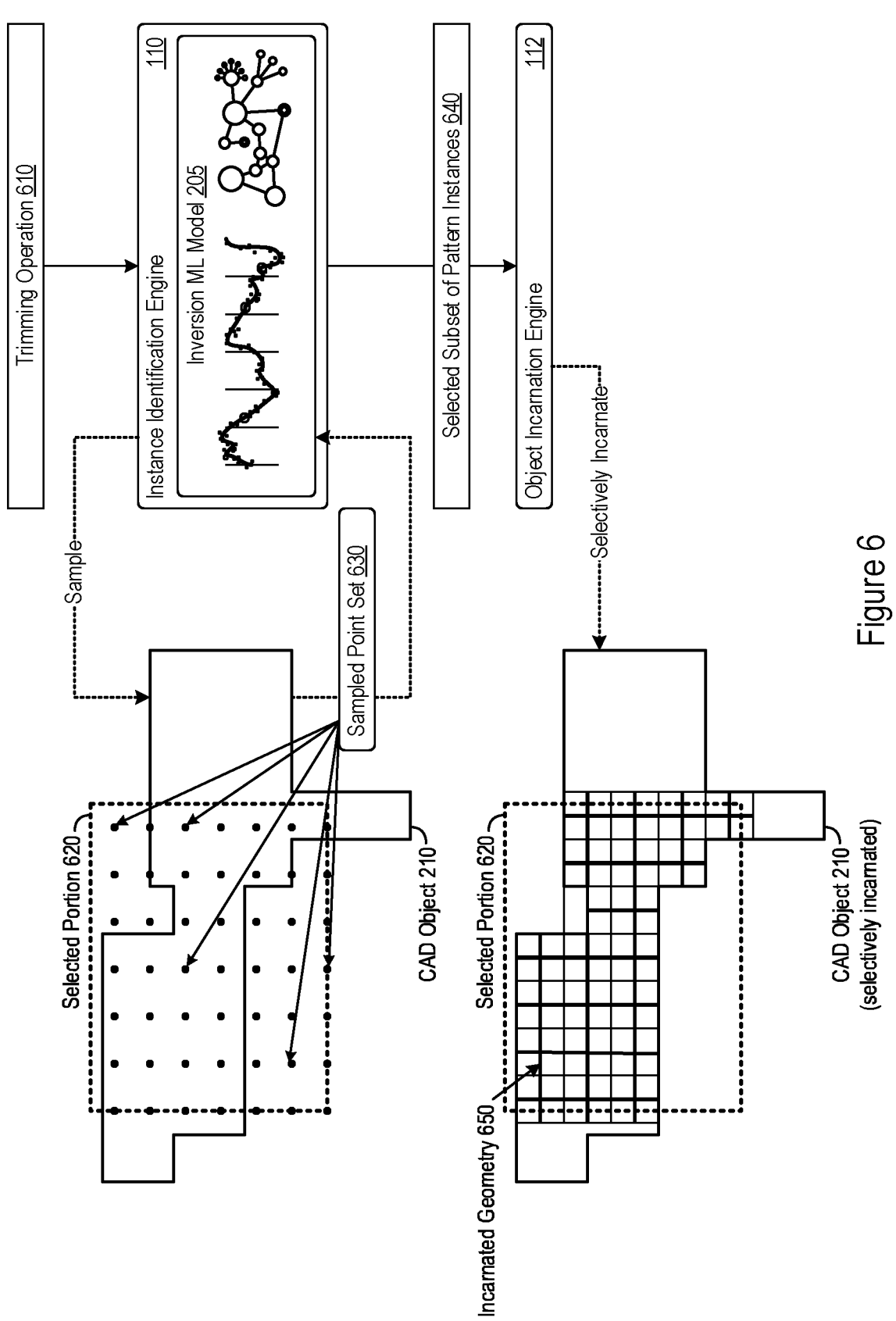
FIG. 6 shows an example of ML-based selective incarnation for a trimming CAD operation.

FIG. 6 shows an example of ML-based selective incarnation for a trimming CAD operation. In FIG. 6, the instance identification engine 110 may identify that a trimming operation 610 is to be performed on the CAD object 210. A trimming operation 610 may cull a geometry of the CAD object 210 to within the bounds of another object (e.g., a user-selected shape), and may be used to retain a portion of a geometry that lies within the interior volume of a CAD object 210. In FIG. 6, the selected portion 620 is provided an illustrative shape to cull the CAD object 210. In some examples, the selected portion 620 may be the boundary of the CAD object 210 itself, e.g., in order to trim portions of pattern instances that lie outside the CAD object 210.

For the trimming operation 610, the instance identification engine 110 may determine a sampled point set of the CAD object 210 applicable to the trimming operation 610. In particular, the instance identification engine 110 may identify a query region Q for the trimming operation 610 as the selected portion 620. The instance identification engine 110 may sample points in the CAD object 210 within the identified query region Q, particularly within the selected portion 620 of the trimming operation 610. In FIG. 6, the instance identification engine 110 obtains the sampled point set 630 collected from the selected portion 620 and provides the sampled point set 630 as an input to the inversion ML model 205. The inversion ML model 205 may output a selected subset of pattern instances 640, which may be specific to the sampled point set 630 collected for the trimming operation 610.

In the example shown in FIG. 6, the selected subset of pattern instances 640 may specify twenty-one (21) particular geometric blocks of programmatic pattern of the CAD object 210 that the inversion ML model 205 may map to the selected portion 620. The object incarnation engine 112 may incarnate the geometry of the selected subset of pattern instances 640 by incarnating a geometry of the pattern instances of the CAD object 210 included in the selected portion 620 of the trimming operation 610 (shown in FIG. 6 as the incarnated geometry 650).

In the specific example of FIG. 6, the instance identification engine 110 may utilize ML-based techniques to identify the twenty-one (21) particular pattern instances applicable to the trimming operation 610, and the object incarnation engine 112 may selectively incarnate the twenty-one (21) particular pattern instances into a geometric form while the other sixteen (16) pattern instances of the CAD object 210 are determined to remain in programmatic form in performing the trimming operation 610. In some implementations, the object incarnation engine 112 may perform the trimming operation 610 by trimming the incarnated geometry 650 outside the selected portion 620 of the CAD object 210.

As such, the instance identification engine 110 and object incarnation engine 112 may support ML-based selective incarnation for trimming operations.

While example selective incarnations are described in FIGS. 4, 5, and 6 for ray-casting, slicing, and trimming CAD operations, the ML-based selective incarnation features described herein may be consistently applied for any type of CAD operation. As examples, for mass property computations, the instance identification engine 110 may identify a query region Q that can cover an CAD object or a particular object portion to perform the mass property computations on. Tessellation CAD operations may likewise include a particular query region Q that the instance identification engine 110 may identify (e.g., a particular object component, a portion of a CAD object visible in a current CAD application view, etc.) In a consistent manner as described herein, determination of sampled point sets in the identified query region Q by the instance identification engine 110, output of selected subsets by the inversion ML model 205, and selective incarnation by the object incarnation engine 112 may be performed for mass property computation operations, tessellation operations, and any other type of CAD operation supported by a CAD system.

FIG. 7 shows an example of logic 700 that a system may implement to support ML-based selective incarnation of CAD objects. For example, the computing system 100 may implement the logic 700 as hardware, executable instructions stored on a machine-readable medium, or as a combination of both. The computing system 100 may implement the logic 700 via the instance identification engine 110 and the object incarnation engine 112, through which the computing system 100 may perform or execute the logic 700 as a method to support ML-based selective incarnation of CAD objects. The following description of the logic 700 is provided using the instance identification engine 110 and the object incarnation engine 112 as examples. However, various other implementation options by systems are possible.

In implementing the logic 700, the instance identification engine 110 may determine a selected subset of pattern instances of a programmatic pattern used to represent a geometry of a CAD object (702). The instance identification engine 110 may do so by determining a sampled point set of the CAD object applicable to a CAD operation to perform on the CAD object (704), providing the sampled point set as an input to an inversion ML model trained to output a given pattern instance of the programmatic pattern for an input point of the CAD object (706), and determining, as the selected subset, an output set of pattern instances provided by the inversion ML model for the sampled point set (708). In implementing the logic, the object incarnation engine 112 may incarnate a geometry of the selected subset of pattern instances to perform the CAD operation on the CAD object (710).

The logic 700 shown in FIG. 7 provides an illustrative example by which a computing system 100 may support ML-based selective incarnation of CAD objects. Additional or alternative steps in the logic 700 are contemplated herein, including according to any features described herein for the instance identification engine 110, object incarnation engine 112, or any combinations thereof.

Figure 8:
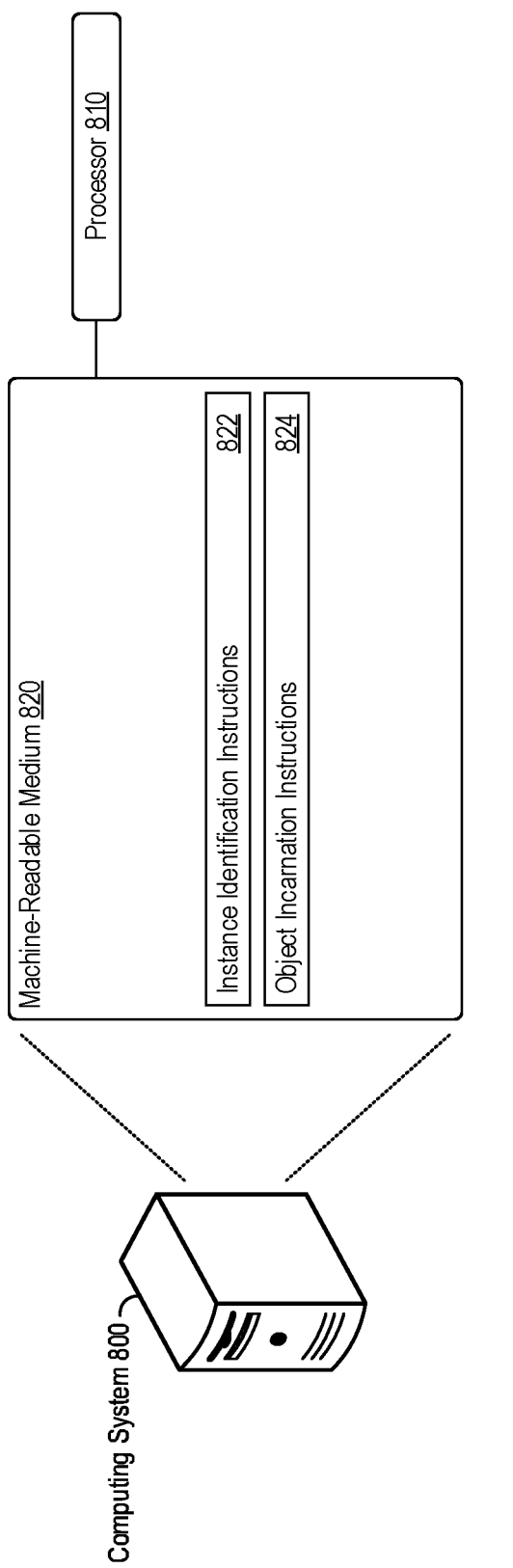
FIG. 8 shows an example of a computing system that supports ML-based selective incarnation of CAD objects.

FIG. 8 shows an example of a computing system 800 that supports ML-based selective incarnation of CAD objects. The computing system 800 may include a processor 810, which may take the form of a single or multiple processors. The processor(s) 810 may include a central processing unit (CPU), microprocessor, or any hardware device suitable for executing instructions stored on a machine-readable medium. The system 800 may include a machine-readable medium 820. The machine-readable medium 820 may take the form of any non-transitory electronic, magnetic, optical, or other physical storage device that stores executable instructions, such as the instance identification instructions 822 and the object incarnation instructions 824 shown in FIG. 8. As such, the machine-readable medium 820 may be, for example, Random Access Memory (RAM) such as a dynamic RAM (DRAM), flash memory, spin-transfer torque memory, an Electrically-Erasable Programmable Read-Only Memory (EEPROM), a storage drive, an optical disk, and the like.

The computing system 800 may execute instructions stored on the machine-readable medium 820 through the processor 810. Executing the instructions (e.g., the instance identification instructions 822 and/or the object incarnation instructions 824) may cause the computing system 800 to perform any of the ML-based selective incarnation features described herein, including according to any of the features described with respect to the instance identification engine 110, the object incarnation engine 112, or a combination of both.

For example, execution of the instance identification instructions 822 by the processor 810 may cause the computing system 800 to determine a selected subset of pattern instances of a programmatic pattern used to represent a geometry of a CAD object, including by determining a sampled point set of the CAD object applicable to a CAD operation to perform on the CAD object; providing the sampled point set as an input to an inversion ML model trained to output a given pattern instance of the programmatic pattern for an input point of the CAD object; and determining, as the selected subset, an output set of pattern instances provided by the inversion ML model for the sampled point set. Execution of the object incarnation instructions 824 may cause the computing system 800 to incarnate a geometry of the selected subset of pattern instances to perform the CAD operation on the CAD object.

Any additional or alternative features as described herein may be implemented via the instance identification instructions 822, object incarnation instructions 824, or a combination of both.

The systems, methods, devices, and logic described above, including the instance identification engine 110 and the object incarnation engine 112, may be implemented in many different ways in many different combinations of hardware, logic, circuitry, and executable instructions stored on a machine-readable medium. For example, the instance identification engine 110, the object incarnation engine 112, or combinations thereof, may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. A product, such as a computer program product, may include a storage medium and machine-readable instructions stored on the medium, which when executed in an endpoint, computer system, or other device, cause the device to perform operations according to any of the description above, including according to any features of the instance identification engine 110, the object incarnation engine 112, or combinations thereof.

The processing capability of the systems, devices, and engines described herein, including the instance identification engine 110 and the object incarnation engine 112, may be distributed among multiple system components, such as among multiple processors and memories, optionally including multiple distributed processing systems or cloud/network elements. Parameters, databases, and other data structures may be separately stored and managed, may be incorporated into a single memory or database, may be logically and physically organized in many different ways, and may be implemented in many ways, including data structures such as linked lists, hash tables, or implicit storage mechanisms. Programs may be parts (e.g., subroutines) of a single program, separate programs, distributed across several memories and processors, or implemented in many different ways, such as in a library (e.g., a shared library).

While various examples have been described above, many more implementations are possible.

The invention claimed is:

1. A method comprising:

by a computing system:

determining a selected subset of pattern instances of a programmatic pattern used to represent a geometry of a computer-aided design (CAD) object, including by:

determining a sampled point set of the CAD object applicable to a CAD operation to perform on the CAD object;

providing the sampled point set as an input to an inversion machine-learning (ML) model trained to output a given pattern instance of the programmatic pattern for an input point of the CAD object; and determining, as the selected subset, an output set of pattern instances provided by the inversion ML model for the sampled point set; and incarnating a geometry of the selected subset of pattern instances to perform the CAD operation on the CAD object.

2. The method of claim 1, further comprising training the inversion ML model by:

generating a training data set for the inversion ML model, including by:

determining, for each given pattern instance of the programmatic pattern that represents the geometry of the CAD object, a sample point located within a geometric block that contains the given pattern instance; and determining the training data set as a mapping between each geometric block and the sample points located within the geometric block; and training the inversion ML model with the generated training data set.

3. The method of claim 2, wherein each geometric block uniquely contains a single pattern instance and wherein the inversion ML model is trained to output a particular pattern instance based on the geometric block that contains the particular pattern instance.

4. The method of claim 1, wherein the CAD operation comprises a ray-casting operation, and comprising:

sampling points in the CAD object along a projected ray of the ray-casting operation;

incarnating the geometry of the selected subset by incarnating a geometry of the pattern instances of the CAD object along the projected ray; and performing the ray-casting operation by performing ray-surface intersection computations on the incarnated geometry of the selected subset.

5. The method of claim 1, wherein the CAD operation comprises a slicing operation, and comprising:

sampling points in the CAD object in a slicing plane of the slicing operation;

incarnating the geometry of the selected subset by incarnating a geometry of the pattern instances of the CAD object in the slicing plane; and performing the slicing operation by computing intersection curves between the incarnated geometry of the selected subset and the slicing plane.

6. The method of claim 1, wherein the CAD operation comprises a trimming operation to remove portions of the programmatic pattern outside a selected portion of the CAD object, and comprising:

sampling points in the CAD object in the selected portion of the CAD object;

incarnating the geometry of the selected subset by incarnating a geometry of the pattern instances of the CAD object in the selected portion; and performing the trimming operation by trimming the incarnated geometry outside the selected portion of the CAD object.

7. The method of claim 1, comprising incarnating the geometry of the selected subset of pattern instances without incarnating non-selected pattern instances of the programmatic pattern.

8. A system comprising:

an instance identification engine configured to determine a selected subset of pattern instances of a programmatic pattern used to represent a geometry of a computer-aided design (CAD) object by:

determining a sampled point set in the CAD object applicable to a CAD operation to perform on the CAD object;

providing the sampled point set as an input to an inversion machine-learning (ML) model trained to output a given pattern instance of the programmatic pattern for an input point of the CAD object; and determining, as the selected subset, an output set of pattern instances provided by the inversion ML model for the sampled point set; and an object incarnation engine configured to incarnate a geometry of the selected subset of pattern instances to perform the CAD operation on the CAD object.

9. The system of claim 8, wherein the instance identification engine is further configured to train the inversion ML model by:

generating a training data set for the inversion ML model by:

determining, for each given pattern instance of the programmatic pattern that represents the geometry of the CAD object, a sample point located within a geometric block that contains the given pattern instance; and determining the training data set as a mapping between each geometric block and the sample point located within the geometric block; and training the inversion ML model with the generated training data set.

10. The system of claim 9, wherein each geometric block uniquely contains a single pattern instance and wherein the inversion ML model is trained to output a particular pattern instance based on the geometric block that contains the particular pattern instance.

11. The system of claim 8, wherein the CAD operation comprises a ray-casting operation, and wherein:

the instance identification engine is configured to sample points in the CAD object along a projected ray of the ray-casting operation; and the object incarnation engine is configured to:

incarnate the geometry of the selected subset by incarnating a geometry of the pattern instances of the CAD object along the projected ray; and perform the ray-casting operation by performing ray-surface intersection computations on the incarnated geometry of the selected subset.

12. The system of claim 8, wherein the CAD operation comprises a slicing operation, and wherein:

the instance identification engine is configured to sample points in the CAD object in a slicing plane of the slicing operation; and the object incarnation engine is configured to:

incarnate the geometry of the selected subset by incarnating a geometry of the pattern instances of the CAD object in the slicing plane; and perform the slicing operation by computing intersection curves between the incarnated geometry of the selected subset and the slicing plane.

13. The system of claim 8, wherein the CAD operation comprises a trimming operation to remove portions of the programmatic pattern outside a selected portion of the CAD object, and wherein:

the instance identification engine is configured to sample points in the CAD object in the selected portion of the CAD object; and the object incarnation engine is configured to:

incarnate the geometry of the selected subset by incarnating a geometry of the pattern instances of the CAD object in the selected portion; and perform the trimming operation by trimming the incarnated geometry outside the selected portion of the CAD object.

14. The system of claim 8, wherein the object incarnation engine configured to incarnate the geometry of the selected subset of pattern instances without incarnating non-selected pattern instances of the programmatic pattern.

15. A non-transitory machine-readable medium comprising instructions that, when executed by a processor, cause a computing system to:

determine a selected subset of pattern instances of a programmatic pattern used to represent a geometry of a computer-aided design (CAD) object, including by:

determining a sampled point set of the CAD object applicable to a CAD operation to perform on the CAD object;

providing the sampled point set as an input to an inversion machine-learning (ML) model trained to output a given pattern instance of the programmatic pattern for an input point of the CAD object; and determining, as the selected subset, an output set of pattern instances provided by the inversion ML model for the sampled point set; and incarnate a geometry of the selected subset of pattern instances to perform the CAD operation on the CAD object.

16. The non-transitory machine-readable medium of claim 15, wherein the instructions further cause the computing system to train the inversion ML model by:

generating a training data set for the inversion ML model, including by:

determining, for each given pattern instance of the programmatic pattern that represents the geometry of the CAD object, a sample point located within a geometric block that contains the given pattern instance; and determining the training data set as a mapping between each geometric block and the sample points located within the geometric block; and training the inversion ML model with the generated training data set.

17. The non-transitory machine-readable medium of claim 15, wherein the CAD operation comprises a ray-casting operation, and wherein the instructions cause the computing system to:

sample points in the CAD object along a projected ray of the ray-casting operation;

incarnate the geometry of the selected subset by incarnating a geometry of the pattern instances of the CAD object along the projected ray; and perform the ray-casting operation by performing ray-surface intersection computations on the incarnated geometry of the selected subset.

18. The non-transitory machine-readable medium of claim 15, wherein the CAD operation comprises a slicing operation, and wherein the instructions cause the computing system to:

sample points in the CAD object in a slicing plane of the slicing operation;

incarnate the geometry of the selected subset by incarnating a geometry of the pattern instances of the CAD object in the slicing plane; and perform the slicing operation by computing intersection curves between the incarnated geometry of the selected subset and the slicing plane.

19. The non-transitory machine-readable medium of claim 15, wherein the CAD operation comprises a trimming operation to remove portions of the programmatic pattern outside a selected portion of the CAD object, and wherein the instructions cause the computing system to:

sample points in the CAD object in the selected portion of the CAD object;

incarnate the geometry of the selected subset by incarnating a geometry of the pattern instances of the CAD object in the selected portion; and perform the trimming operation by trimming the incarnated geometry outside the selected portion of the CAD object.

20. The non-transitory machine-readable medium of claim 15, wherein the instructions cause the computing system to incarnate the geometry of the selected subset of pattern instances without incarnating non-selected pattern instances of the programmatic pattern.

* * * * *